(12) United States Patent
Blair et al.

(10) Patent No.: US 7,870,115 B2
(45) Date of Patent: *Jan. 11, 2011

(54) VARIABLE LENGTH FILE HEADER APPARATUS AND SYSTEM

(75) Inventors: William R. Blair, Erie, PA (US); David J. Tetuan, Erie, PA (US)

(73) Assignee: Ariba, Inc., Sunnyvale, CA (US)

( * ) Notice: Subject to any disclaimer, the term of this patent is extended or adjusted under 35 U.S.C. 154(b) by 416 days.

This patent is subject to a terminal disclaimer.

(21) Appl. No.: 11/903,459

(22) Filed: Sep. 21, 2007

(65) Prior Publication Data

US 2008/0059612 A1      Mar. 6, 2008

Related U.S. Application Data

(63) Continuation of application No. 10/279,864, filed on Oct. 25, 2002, now Pat. No. 7,277,878, which is a continuation-in-part of application No. 09/782,620, filed on Feb. 13, 2001, now Pat. No. 7,072,061.

(51) Int. Cl.
*G06F 7/00*     (2006.01)
*G06F 17/30*   (2006.01)

(52) U.S. Cl. .................... 707/705; 707/803; 707/804

(58) Field of Classification Search ............... 707/1–10, 707/100–104.1, 200–206; 705/14.71, 37
See application file for complete search history.

(56) References Cited

U.S. PATENT DOCUMENTS

| | | | | |
|---|---|---|---|---|
| 6,055,543 A | * | 4/2000 | Christensen et al. | 707/104.1 |
| 6,058,379 A | * | 5/2000 | Odom et al. | 705/37 |
| 6,085,198 A | * | 7/2000 | Skinner et al. | 1/1 |
| 6,161,099 A | * | 12/2000 | Harrington et al. | 705/36 R |
| 6,266,652 B1 | * | 7/2001 | Godin et al. | 705/37 |
| 6,832,264 B1 | * | 12/2004 | Sheinwald et al. | 709/247 |
| 2001/0029478 A1 | * | 10/2001 | Laster et al. | 705/37 |
| 2002/0016725 A1 | * | 2/2002 | Eichstaedt et al. | 705/7 |
| 2002/0026408 A1 | * | 2/2002 | O'Malley et al. | 705/37 |
| 2002/0049763 A1 | * | 4/2002 | Seamon | 707/100 |
| 2002/0069157 A1 | * | 6/2002 | Jordan | 705/37 |

(Continued)

OTHER PUBLICATIONS

Danny Cohen, "Computerized Commerce," Aug. 28 to Sep. 1, 1989, Information Processing '89—Proceedings of the IFIP 11th World Computer Congress, 1095-1100.*

(Continued)

*Primary Examiner*—Jean B Fleurantin
(74) *Attorney, Agent, or Firm*—Van Pelt, Yi & James LLP

(57) ABSTRACT

A viewing configuration is determined for a data portion of a first computer file according to a first view state. The viewing configuration has a parameter, and the first view state includes a first value corresponding to the parameter. The content of the first data portion of the first computer file is presented to a display device based on the viewing configuration. In response to a user request, the presenting is manipulated corresponding to another viewing configuration having the parameter. A second view state is captured from the another viewing configuration. The second view state includes a second value corresponding to the parameter of the another viewing configuration. A second header portion and a second data portion of a second computer file are created.

25 Claims, 7 Drawing Sheets

U.S. PATENT DOCUMENTS

| | | | |
|---|---|---|---|
| 2003/0139975 A1* | 7/2003 | Perkowski | 705/26 |
| 2004/0117213 A1* | 6/2004 | Pache et al. | 705/2 |
| 2004/0215467 A1* | 10/2004 | Coffman et al. | 705/1 |
| 2004/0230572 A1* | 11/2004 | Omoigui | 707/3 |
| 2004/0237094 A1* | 11/2004 | Vambenepe et al. | 719/328 |
| 2005/0004838 A1* | 1/2005 | Perkowski et al. | 705/14 |
| 2005/0033845 A1* | 2/2005 | Perepa et al. | 709/226 |
| 2005/0091220 A1* | 4/2005 | Klemow | 707/10 |
| 2005/0216421 A1* | 9/2005 | Barry et al. | 705/64 |
| 2005/0246265 A1* | 11/2005 | McHale et al. | 705/37 |

OTHER PUBLICATIONS

Kikuchi et al., Multi-Round Anonymous Auction Protocols, Apr. 1999, Google, vol. E82-D, 769-777.*

* cited by examiner

BMP (Windows) Header Format
Windows BMP files begin with a 54-byte header:

| Offset | Size | Description |
|---|---|---|
| 0 | 2 | Signature, or "magic identifier" |
| 2 | 4 | Size of BMP file in bytes |
| 6 | 2 | Reserved, must be zero |
| 8 | 2 | Reserved, must be zero |
| 10 | 4 | Offset to start of image data in bytes |
| 14 | 4 | Size of BITMAPINFOHEADER structure (must be 40) |
| 18 | 4 | Image width in pixels |
| 22 | 4 | Image height in pixels |
| 26 | 2 | Number of color planes in the image |
| 28 | 2 | Bits per pixel (1,4,8, or 24) |
| 30 | 4 | Compression type (0=none, 1=RLE-8, 2=RLE-4, 3=RGB) |
| 34 | 4 | Size of image data in bytes |
| 38 | 4 | Horizontal resolution in pixels per meter |
| 42 | 4 | Vertical resolution in pixels per meter |
| 46 | 4 | Number of colors in image, or zero |
| 50 | 4 | Number of important colors, or zero |

FIG. 1

| Code | Description | Data Type |
|---|---|---|
| CU | Customer | ASCII |
| CB | Competitive Bidding Event Number | Real |
| CR | Competitive Bidding Event Revision | Real |
| CV | Competitive Release Date | Date |
| CA | Created By | ASCII |
| CD | Customer Division | ASCII |
| DN | Drawing Number | ASCII |
| DV | Drawing Version | ASCII |
| CS | Customer Site | ASCII |
| FN | Original File Name | ASCII |
| FC | Fconvert Version | Real |
| FD | FMG Date | Date |
| EA | Absolute Expiration | Date |
| ER | Relative Expiration | Integer |
| DT | Document Type | ASCII |
| PF | Print Disabled Flag | Integer |
| GS | Graphics Size | Integer |
| EG | Enciphered Graphics | NULL |

FIG. 3

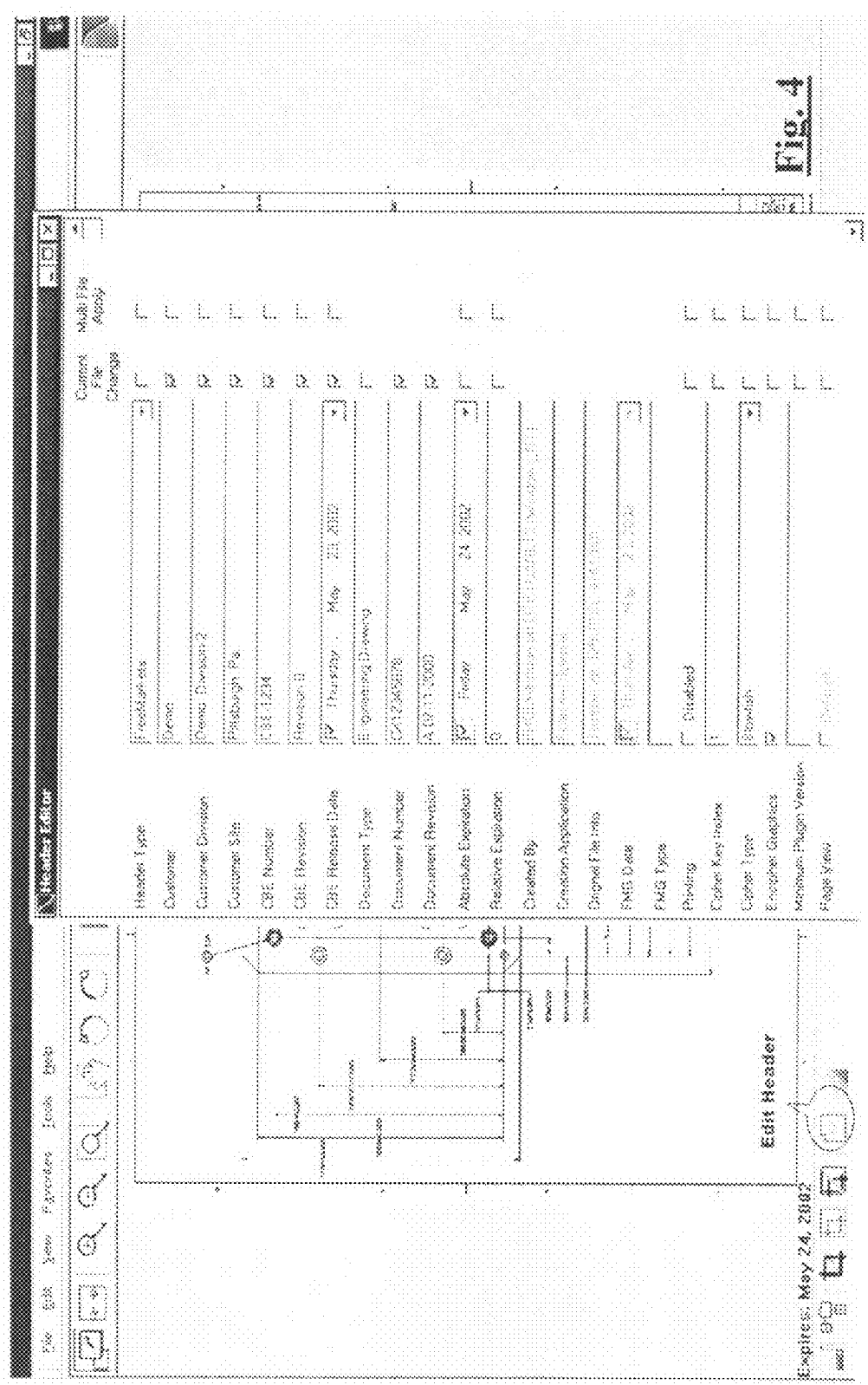

VARIABLE LENGTH FILE HEADER APPARATUS AND SYSTEM

CROSS-REFERENCE TO RELATED APPLICATION

This application is a continuation of U.S. application Ser. No. 10/279,864, filed Oct. 25, 2002 now U.S. Pat. No. 7,277,878, which is a continuation-in-part of U.S. application Ser. No. 09/782,620, now U.S. Pat. No. 7,072,061, filed Feb. 13, 2001, and both are hereby incorporated by reference.

BACKGROUND OF THE INVENTION

1. Field of the Invention

The present invention relates to an apparatus and system for implementing variable-length file headers, and in particular to a file header that utilizes a varying number of parameters to store meta-data about the contents of the data stored in the file.

2. Description of Related Art

Electronic files have long been used to store data used in computer applications. While at the most basic level, all electronic files contain a collection of bits and bytes, the format of the data in an electronic file may vary greatly. For instance, a simple data file may contain a number of records that are all arranged into a predefined format. In the simplest case, the format is identical for each record. For example, a simple data file may contain records that are formatted to include an integer record number field, a date field, and a 2-character text field. In this case, each record is exactly the same length, as each record has exactly the same fields, and each field has a predefined length.

Data files containing fixed-length records have limitations though, as all of the data must be in the predefined format. Because the data has to be structured into fixed format records, many types of data, such as bitmap images, cannot be stored in files comprised of fixed-length records. Therefore, alternative file formats have been developed. One widely used method of structuring data in an electronic file is to store information about the data, the "meta-data", in a file header section of the file, while storing the data itself in a data section of the file. The meta-data in the header section typically provides information to application reading the electronic file about how to read, interpret, process or display the data stored in the data section. Typically, file formats that incorporate file headers have a predefined file header section at the beginning of the file followed by a variable-length data section. By storing the meta-data in a predefined format, it is relatively easy for an application to read and use the data by simply parsing the known format of the header to obtain the information needed to read, process or interpret the data in the data section.

The use of file headers has made it possible for data that cannot be stored in fixed-length record formats to be stored in an electronic file in a format that can be used by many applications. For example, several different platform-independent formats have been developed for the storage of bitmap image data in electronic files. Most of these file formats consist of two sections—a file header and a binary image data section, although some formats may have additional sections in the file. The header may be separated from the image data by a special control character, or the header may be defined in such a way that the application reading the file can determine where the image data is stored within the file. The header section typically contains information about the image, while the image data section contains the actual image data. BMP (Windows), PCX (PC Paintbrush), and GIF (Graphics Image Format) are all examples of image file formats that utilize file headers.

Image file headers typically define the image size, number of colors, and other information needed by an application to display the image. FIG. 1 illustrates the structure of the file header used in BMP files. As shown, each field in the header is of a fixed length, and every field must be present in the correct order for an application reading the file to properly display or use the image data, even if some of the fields in the header do not have a value. The BMP file header is always exactly 54 bytes long.

File formats with these types of predefined, fixed-length file headers are limited in many ways. Only very particular, pre-determined information or meta-data can be stored in the header. While some fields in the header may be reserved for future use, it is very difficult to change the file header after it has been defined and in use, as every application that uses the fixed format must be updated if the format is changed.

These types of fixed file header formats work well for data that does not require a large amount of meta-data, such as a simple bitmap image file. However, there are cases when it would be desirable to store varying amounts of diverse meta-data in a file header. One example of a situation where fixed-length predefined file headers are inadequate is described in co-pending application Ser. No. 09/782,620, entitled "Method and System for Extracting Information from RFQ documents and Compressing RFQ files into a Common File Format", filed Feb. 13, 2001, which is hereby incorporated by reference. As described in this application, the current assignee has developed a method and system of converting numerous types of electronic documents into a common compressed file type, whereby a single viewing application can be used to view any document that has been converted to the common compressed file type.

Many different types of files can be converted into a single common file type using the disclosed method and system. Because of the wide variety of information that may be in the original documents, it is difficult to define a fixed-format file header that will capture all information that may be desirable to store with the compressed data. Even if it were possible to define a fixed-format that would adequately store data for all currently known types of information, it is impossible to predict what additional types and amount of information that would be desirable to store in the future.

Thus, what is needed is a method and system for storing variable amounts and types of information in a file header.

SUMMARY OF THE INVENTION

In accordance with one form of the present invention, there is provided a method and system of creating a file header for a computer file that provides meta-data about data stored in a data portion of a computer file, wherein the header is comprised of a plurality of header fields. The method includes storing a data tag in each header field, whereby the data tag indicates the type of header field; and for storing a meta-data item for each header field, whereby the type of meta-data item is defined by the data tag; whereby at least one header field contains a meta-data item used by an application to categorize the computer file.

A method and system for ensuring that a file originating on a first computer running a first application is stored in a proper location on a second computer running a second application, where the file is comprised of a file header section and a data section is also disclosed. The method includes inserting storage location information in the file header by the first application; extracting the storage location information from the file header by the second application; and determining a storage location on the second computer by the second application based on the extracted storage location information.

A method and system for creating the header portion of a computer file comprised of a header portion and a data portion, wherein the header portion provides meta-data about the data stored in the data portion, wherein the header portion is comprised of at least one field is also disclosed. The method includes storing a data tag in each header field, whereby the data tag indicates the type of field; and storing meta-data about the data portion of the file in each header field whereby the meta-data in the field is defined by the data tag in the field, for each field in the header; whereby the meta-data in at least one field is comprised of data that is used by an application to define an expiration date for the computer file.

A method and system for ensuring that a user obtains a correct version of a file, where the file is comprised of a file header section and a data section is also disclosed. The method includes inserting expiration information in the file header by a first application; extracting the expiration information from the file header by a second application; determining an expiration date for the file from the extracted expiration information by the second application; and comparing the determined expiration date to another date by the second application; wherein use of the file is disallowed by the second application if the comparison determines that the file has expired.

A method and system for creating the header portion of a computer file comprised of a header portion and a data portion, wherein said header portion provides meta-data about the image stored in the image data portion, wherein the header portion is comprised of at least one field is also disclosed. The method includes storing a data tag in each field of the header, whereby a data tag indicates the field type; and storing meta-data about the image data portion of the file in each field whereby the type and format of the meta-data in the field is defined by the field's data tag; whereby the meta-data in at least one field is comprised of data that is used by an application to automatically configure how the image stored in the image data portion is displayed.

A method and system for displaying an image in a predetermined view state, where the image is stored in a file comprised of a file header section and an image data section is also disclosed. The method includes a first application inserting view state information in the file header; a second application extracting the view state information from the file header; and displaying the image by the second application, wherein the second application uses the extracted view state information to configure the display of the image.

Accordingly, the present invention provides solutions to the shortcomings of prior file acquisition and processing techniques. Those of ordinary skill in the art will readily appreciate, therefore, that those and other details, features, and advantages will become apparent in the following detailed description of the preferred embodiments.

DESCRIPTION OF THE FIGURES

The accompanying drawings, wherein like references numerals are employed to designate like parts or steps, are included to provide a further understanding of the invention, are incorporated in and constitute a part of this specification, and illustrate embodiments of the invention that together with the description serve to explain the principles of the invention.

In the figures:

FIG. 1 is a table illustrating the format of the Windows BMP file header.

FIG. 3 is a table illustrating some of the codes that may be used as header tags.

FIG. 4 illustrates an example interface for entering header information during the conversion process.

DETAILED DESCRIPTION

Figure 2:
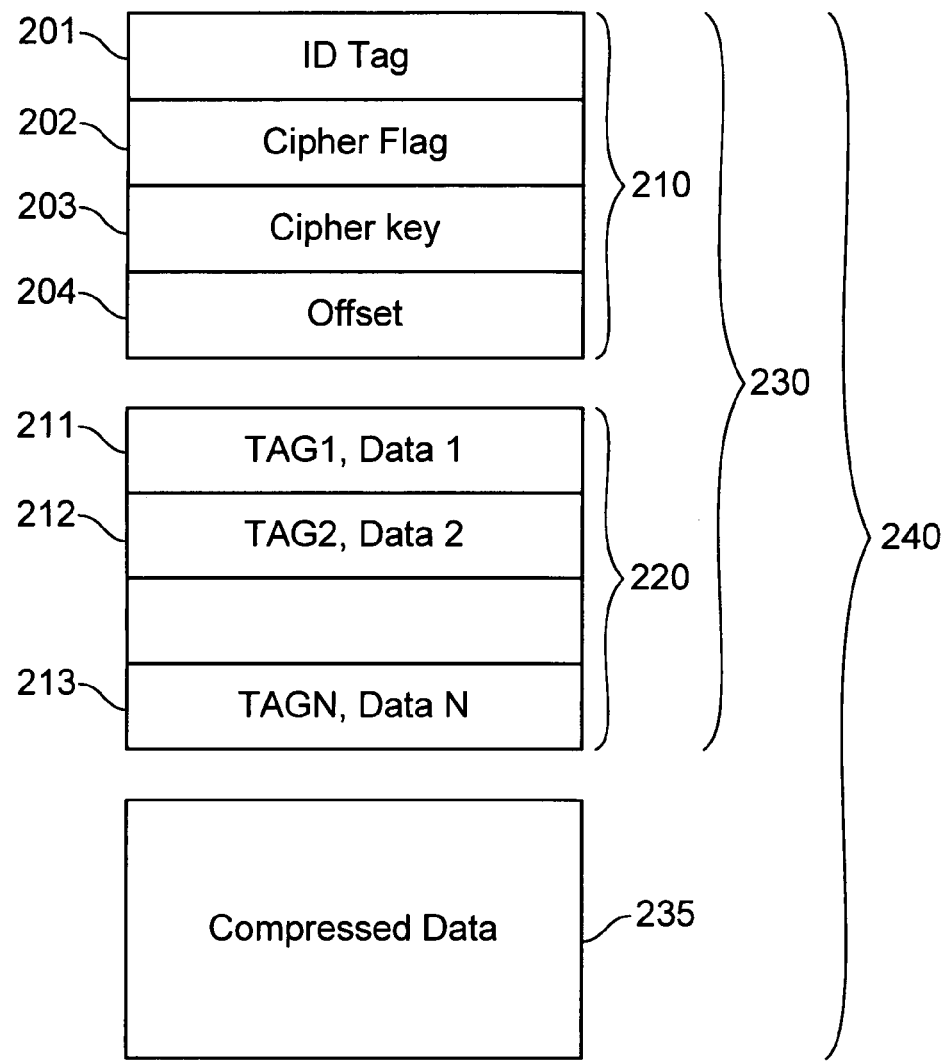
FIG. 2 illustrates the format for a RFQ compressed file.

Reference will now be made in detail to the preferred embodiments of the present invention, examples of which are illustrated in the accompanying drawings. It is to be understood that the Figures and the description of the present invention included herein illustrate and describe elements that are of particular relevance to the present invention, while eliminating, for purposes of clarity, other elements that may be found in typical auction systems and computer networks.

It is worthy to note that any reference in the specification to "one embodiment" or "an embodiment" means that a particular feature, structure or characteristic described in connection with the embodiment is included in at least one embodiment of the invention. The appearances of the phrase "in one embodiment" in various places in the specification are not necessarily all referring to the same embodiment.

The present invention is directed to a method and apparatus for a variable-length file header. The invention is described herein using the file conversion process described in co-pending application No. Ser. No. 09/782,620, previously incorporated by reference, as an example. The method disclosed in this co-pending application compresses a file such that no information is lost in the conversion process and a single viewing application can be used to view the resultant compressed file. However, other types of files besides files converted using the disclosed method may use the file header apparatus and system of the present invention, and it is intended that the scope of the present invention cover any such case.

The method and system of previously incorporated by reference co-pending application Ser. No. 09/782,620 will be briefly described so that it can be used by way of example herein. In brief, a Request For Quotations (RFQ) is used to provide information to potential bidders in an electronic auction, or in other procurement processes, about the services or goods in the auction. For example, a RFQ may contain engineering drawings, manufacturing specifications, quality specifications, auction specific information and buyer information. In order to publish an electronic RFQ, all of this information must be gathered from different sources, and converted to a common electronic file format. The system disclosed in the co-pending Application is used to convert the various documents from their native formats to a common format. The system extracts important information from documents, converts the documents into raster images, compresses the raster images and then stores the compressed images with the extracted information in an "RFQ compressed format" file. Although the term "RFQ compressed format" is used herein, it will be obvious to those skilled in the art that the disclosed compressed file format could be used by many applications other than the electronic RFQ publication.

The electronic files may first be converted to an intermediate file format, such as PDF (Portable Document Format from Adobe Acrobat). In one embodiment, hyperlink information may be extracted from text documents and saved. In another embodiment, symbol information in CAD files may be extracted and saved. All documents are converted into a common raster image format, such as TIFF (Tag Image File Format). Once the documents have been converted into the common raster format, the raster images are compressed preferably using a wavelet compression scheme. Wavelet compression creates a highly compressed file format suitable for transmitting over low bandwidth connections. Any information that may have been extracted may be re-inserted into the compressed file, and a "RFQ compressed format" file is created.

Both text-based documents and engineering drawings are converted to one common format. By compressing all of the files into a common format, only one viewing application is needed, and the viewing time is minimized. No matter what native format a document in an RFQ started as, when it is delivered as part of the electronic RFQ generated by the disclosed system, only a single viewing application is needed to decode and view the document. The RFQ compressed format therefore provides for the consolidation of all data across a common format, while preserving valuable information from the RFQ input files.

It is therefore advantageous to "publish" an electronic RFQ such that all of the RFQ documents are stored in the RFQ compressed format. By using a single file format, a reader of the RFQ need only have a single viewing application to view every document in the RFQ.

In a preferred embodiment, the RFQ compressed file format follows standard industry practice, and is comprised of a file header followed by the compressed data. As is typical for most file headers, the RFQ compressed file format header contains meta-data, or information regarding the compressed data that follows it. Some of this information is typical display and compression information, however, the RFQ compressed file format header may also store additional meta-data about the document that is compressed within the file.

An electronic RFQ used in an online auction contains a wide variety of information. Within a single RFQ, there may be many different types of documents that originated as text, image or CAD drawings. In addition, different buyers have different requirements and utilize different systems to create the documents that are used in an electronic RFQ. It is desirable to store this information relating to the original documents with the converted document. It is desirable to store information about an online auction with any converted documents that are used in that online auction's electronic RFQ. It is desirable to store other types of meta-data with the converted document.

However, only one format for a RFQ compressed file can exist. It would be extremely difficult to try to anticipate every type of meta-data that could be stored with the converted document and create a field for it in the file header. In addition, it would be very wasteful to include every possible field in every RFQ compressed file, as some of the fields will only be used in limited situations. Therefore, the assignee of the present invention has created a variable-length header for the RFQ compressed file.

FIG. 2 illustrates the structure of the RFQ compressed file using the variable-length file header of the present invention. Block 240 represents the entire RFQ compressed file, which is comprised of header 230 and data 235. In a preferred embodiment, header 230 is comprised of an identifying section 210 and header data section 220.

The identifying section of the header 210 is shown with four fields, although more or fewer may be used. In the example shown in FIG. 2, the identifying section 210 is comprised of an ID Tag field 201, Cipher flag field 202, Cipher key field 203 and Offset 204. ID Tag field 201 is preferably an ASCII tag indicating the file type. Cipher flag field 202 is preferably a flag indicating whether enciphering is in use. If the file is enciphered, Cipher key field 203 is preferably used as an index into a key file. Enciphering will be described in more detail below. Offset 204 is preferably an integer that represents an offset from the beginning of the file to the beginning of the compressed data 235. Offset 204 is typically the number of bytes from the beginning of the file to the data section.

In a preferred embodiment, header data section 220 and/or Offset 204 are enciphered to prevent unauthorized access and alteration of the data. A preferred cipher mechanism is the public domain Blowfish algorithm. Other cipher methods are known to those skilled in the art, and are intended to come within the scope of the present invention.

As shown by header data section 220, the present invention utilizes tags in the header to allow for a variable number of fields in the header. Each field in header data section 220 consists of a data tag, the field's data and at least one control character used as an "end of field" character. As an alternative to control character(s), each type of header field may be of a known, fixed length. Header data section 220 may contain 0 to N data tags. It is this feature that provides flexibility. Any number of tags may be defined to allow for any amount of meta-data to be stored in the header. Unlike previous file headers having a fixed number of fields, the present invention provides for a variable number of header fields.

An application that parses the header of the present invention can then use any of the information stored in the header for any purpose. By using a tagged header format, the present invention allows for future tags to be defined. Because only fields that have information associated with them need to be saved in the file header, valuable space is saved. There is no requirement to have any tags saved with the file.

The software used to read, write, parse, and optionally encipher and decipher the header is preferably isolated as a component so that it may be reused by any application that accesses the RFQ compressed format files. The component may be delivered as a DLL (Dynamic Link Library) so that it may be embedded within an application to the prevent exposure of the API (Application Program Interface).

FIG. 3 illustrates some of the tags that may be used in the file header of the present invention. The tags shown in FIG. 3 demonstrate just an example of the types of tags that can be used in the file header apparatus of the present invention. The tag codes shown in FIG. 3 are codes identifying data that is useful to store in the context of electronic RFQs used in online auctions. As will be obvious to one skilled in the art, any number and type of code may be defined and used to identify a header field. Any type of information may be stored in the header. All that is required is that a unique tag code be defined for a particular piece of information.

Some of the codes shown in FIG. 3 are discussed in more detail below.

Auction and Customer Information

Due to the manual nature of the RFQ creation process, there is the possibility that files from one customer may inadvertently be placed in another customer's RFQ. For example, company X's engineering drawings end up in company Y's RFQ because a user processing files using a drag-and-drop operation accidentally places the files in the wrong location. The file header of the present invention can be used to mitigate this problem by storing customer and competitive bidding event information in the header of converted files. The tags that have been created for these fields are shown in FIG. 3 as Customer (CU), Competitive Bidding Event Number (CB), Competitive Bidding Event Revision (CR), and Competitive Bidding Event Release Date (CV).

When the electronic RFQ is published, this information may be verified to ensure that only files that are supposed to be published for a particular RFQ are indeed published. An application publishing the RFQ can perform the verification by comparing the Customer and/or Competitive Bidding Event information in a file's header against the RFQ's information. By using these fields in the header, the application can then perform referential integrity on the collection of files used in an electronic RFQ. As will be obvious to those skilled in the art, there are many other referential integrity applications that may use the variable length header of the present invention, and the present invention is not intended to be limited to the publishing electronic RFQs for online auctions.

An example of the interface that can be used to set these fields in a header is shown in FIG. 4. This example interface is utilized in an application used to perform post-processing and quality assurance on files that have been converted to the RFQ compressed format. These RFQ compressed files will be used in the publication of an electronic RFQ for a particular competitive bidding event for the auction sponsor. As shown in FIG. 4, the user enters the Customer, CBE (Competitive Bidding Event) Number, Revision and Release date. There are also fields that can be used to store the user's name, customer division that created the original file, drawing number information, customer site information, and so on. The fields shown in FIG. 4 may require manual entry, or they can be populated with default values during the conversion process that the user can change. Any part of or all of this information can be stored in the variable-length header of the present invention. Each entry is stored as a separate field in the header, each with its own unique tag.

Expiration Date

As shown in FIG. 3, two tags that may be used in the variable-length file header of the present invention include EA (Absolute Expiration) and ER (Relative Expiration). The Absolute Expiration tag sets the date on which the RFQ compressed file will "expire." That is, when the viewing application loads the file, it compares the expiration date in the file header to the current date. If the current date is after the expiration date in the file header, the file has "expired", and the viewing application will not display the compressed image. Additionally, in a preferred embodiment, the viewing application will also not print the file once it has expired.

The Relative Expiration date tag works in a similar manner. This tag contains an integer that represents the number of days used to calculate the expiration date of the RFQ compressed file. In one embodiment, the Relative Expiration date calculation requires that the Competitive Bidding Release date (CV) tag also be set. In this embodiment, the Relative Expiration date is calculated by adding the number of days set in the Relative Expiration field to the Competitive Bidding Event Release date. If the current date is after this calculated expiration date, the file has "expired". In a preferred embodiment, if the Competitive Bidding Event Release date tag is not set, the Relative Expiration Date may be ignored. In alternative embodiments, the expiration date of the file may be calculated by adding the Relative Expiration to other variables, such as a timestamp on another file, or a date stored on the displaying system. There are many alternative methods of calculating an expiration date using a Relative Expiration value that will be obvious to those skilled in the art, and it is intended that the scope of the present invention include these alternatives.

In a preferred embodiment, if the Relative Expiration value is set as well as the Absolute Expiration, the Absolute Expiration takes precedence. That is, if a file has not "expired" according to the Relative Expiration, but has "expired" according to the Absolute Expiration, it is treated as an expired file.

The expiration date fields can be used in a number of ways. For example, the expiration date field can be used to ensure that a user is viewing a current version of a drawing or document. Because drawings and documents are constantly under revision, it is easy for a user to accidentally rely on the information in an out-of-date document or drawing simply because he does not know there is a newer version of the file. If an expiration date corresponding to the expected date of the next revision of a document is stored in the file header, and the viewing application disallows display or printing of the document after this expiration date, the user will be forced to acquire the latest version of the document. There are many other uses for the expiration date fields, as will be obvious to those skilled in the art, and it is intended that these uses come within the scope of the present invention.

Image View State

One of the more common problems associated with image data is that frequently the user must manipulate the image when it is first displayed in order to optimally view the image. For example, the document may be a portrait document, but was scanned in landscape mode, and is therefore rotated 90 degrees when initially displayed by a viewing application. In this example, a user must rotate it back 90 degrees in order to properly view it. As another example, the image of interest to the user may be smaller than the entire scanned area. This results in a very small image surrounded by white space. In this case the user must zoom the image in order to achieve an adequate view state. One of the features of the present invention is the ability to capture a view state that corresponds to a particular viewing configuration, and store this view state in the header of the RFQ compressed file. When the file is subsequently displayed, the view state saved in the header is used by the viewing application to display the compressed image such that a good initial presentation of the image that requires no additional manipulation by the user is displayed. By saving view state information in the header, the image itself is not modified.

This is an important feature in the context of the publication of electronic RFQs. The documents that are used in an electronic RFQ are typically converted to the RFQ compressed format in batch processing. The initial documents may be stored in any orientation, and may have originally been paper documents that were scanned. For any number of reasons, the documents are frequently not stored in an optimal view state. In the present invention, a user can manipulate the image to an optimal view state in an application, then save this view state with the image—without changing the image data itself.

This view state can then be considered the base view state, in that any future fit operations will use this view state rather than the original image. The printing function may also be modified to use this view state to output the image.

The present invention saves a view state in the file header, but does not alter the image data itself. This feature is important because it would take a great deal of effort to re-convert a document in such a manner that it is saved in an optimal view state. This feature allows a user to set the optimal view state, then save it without changing the image data itself. This portion of the header acts as a set of directives to the viewing application to display the image in a certain manner.

The view state data may include rotation, scale, page and x and y offset information, for example. In a preferred embodiment, the view state is saved in the header in the following format:

VS,,<rotation>,<scale>,<xoff>,<yoff>

In the above format, "VS" is the tag for view state field. The Page # parameter is an integer indicating the page to which the view state applies if the document is a multi-page document. In a preferred embodiment, if the value is set to zero (or some other defined value), the view state is applied to all pages in the file. Rotation is an integer representing the degrees of rotation in the clockwise direction. For example, a value of 90 means that the image should be rotated 90 degrees in the clockwise direction by the viewing application. In a preferred embodiment, valid values for the Rotation parameter may be limited. For example, valid Rotation values may be limited to 0, 90, 180 and 270. Scale is a real number that represents the zoom that viewing application should set for the image. Xoff and Yoff represent the horizontal and vertical offsets from the image origin to which the viewing application should center the image on the display. As will be apparent to one skilled in the art, not all of the above-identified parameters are required when saving view state information. In addition, in alternative embodiments, it may be desirable to add further parameters to the View State field. The parameters itemized above were given by way of example, and are not intended to be limiting.

The viewing application should capable of interpreting this header field and using the data stored in the field to fit the image to the user's display device. If a user is using a version of a viewing application that does not recognize this tag, the viewing application will preferably ignore this field, and display the image in its original state. It is a feature of the present invention that if the viewing application does not recognize a tag in the header, then it can simply ignore that field of the header. In this manner, extra tags should not cause errors, and new tags can be created as needed. The viewing application can updated as needed to recognize and process new tags.

In a preferred embodiment, the viewing application may have an "Original Tool" that can be used to revert the image to its original view state. The information saved in the VS field will be ignored by the viewing application in this case. The Original Tool may have an option to remove all view states, or just revert to the original state on the current page.

Figure 5:
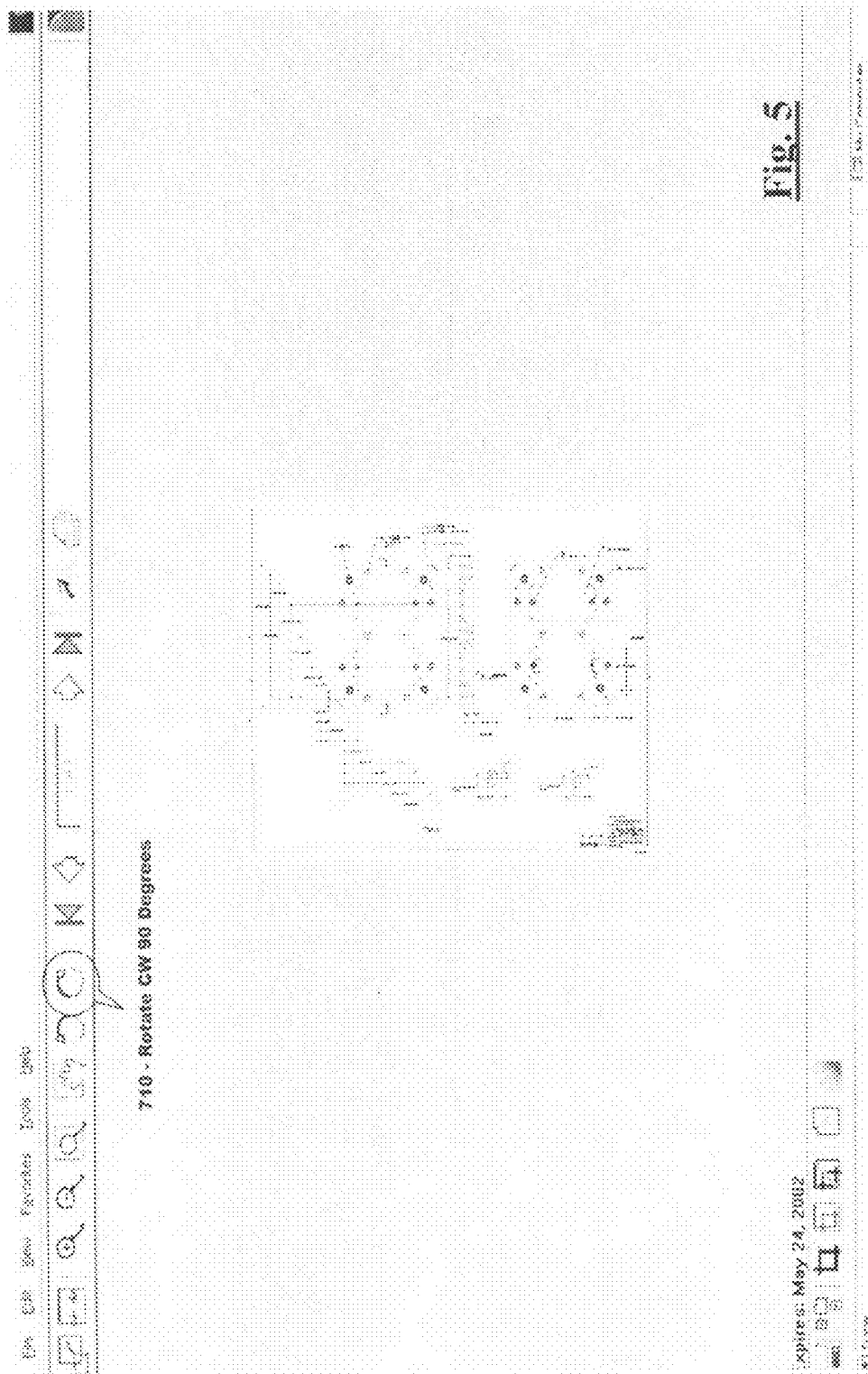
FIG. 5 illustrates an original view of a drawing after conversion.
Figure 6:
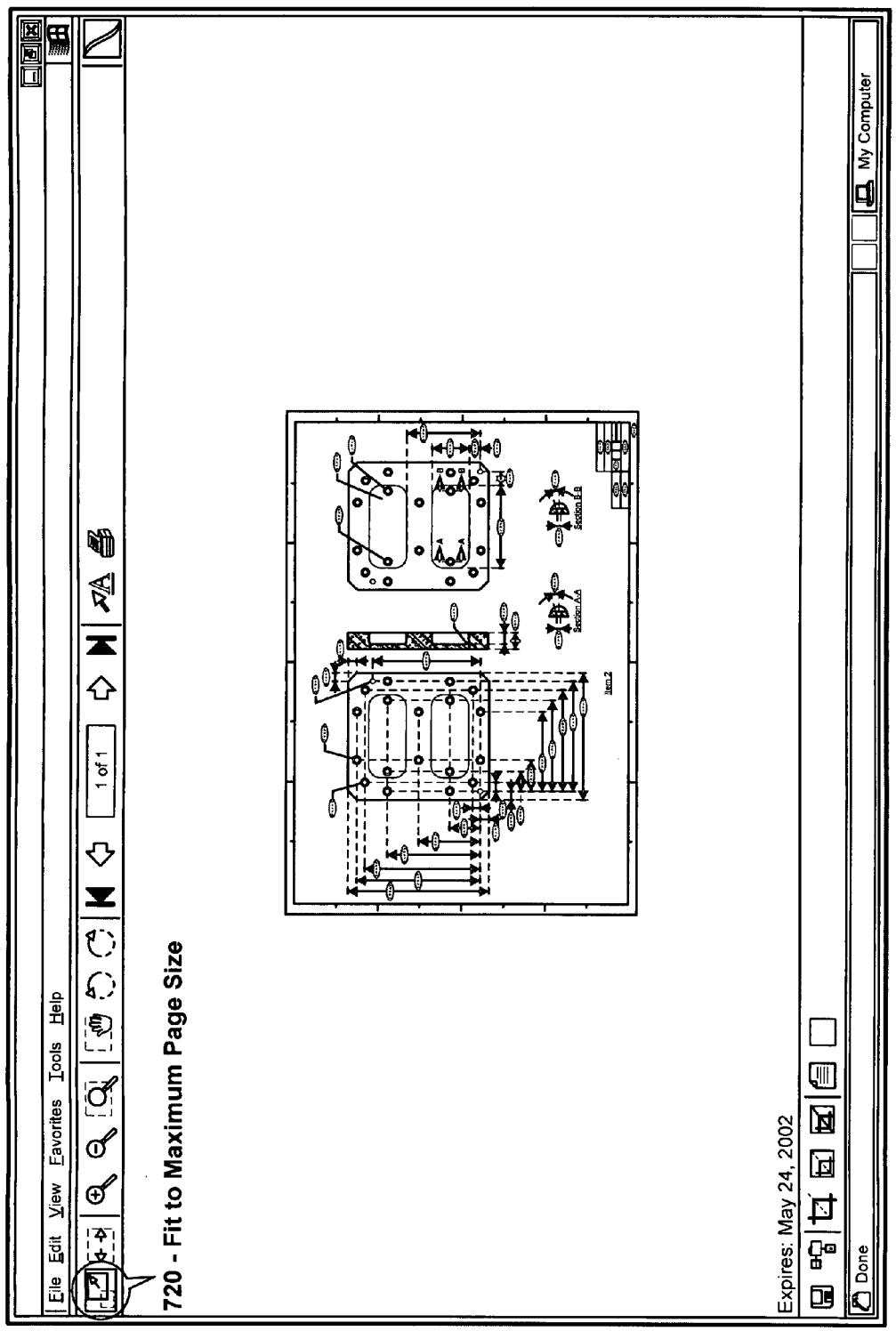
FIG. 6 illustrates a rotated view of the drawing in FIG. 5.
Figure 7:
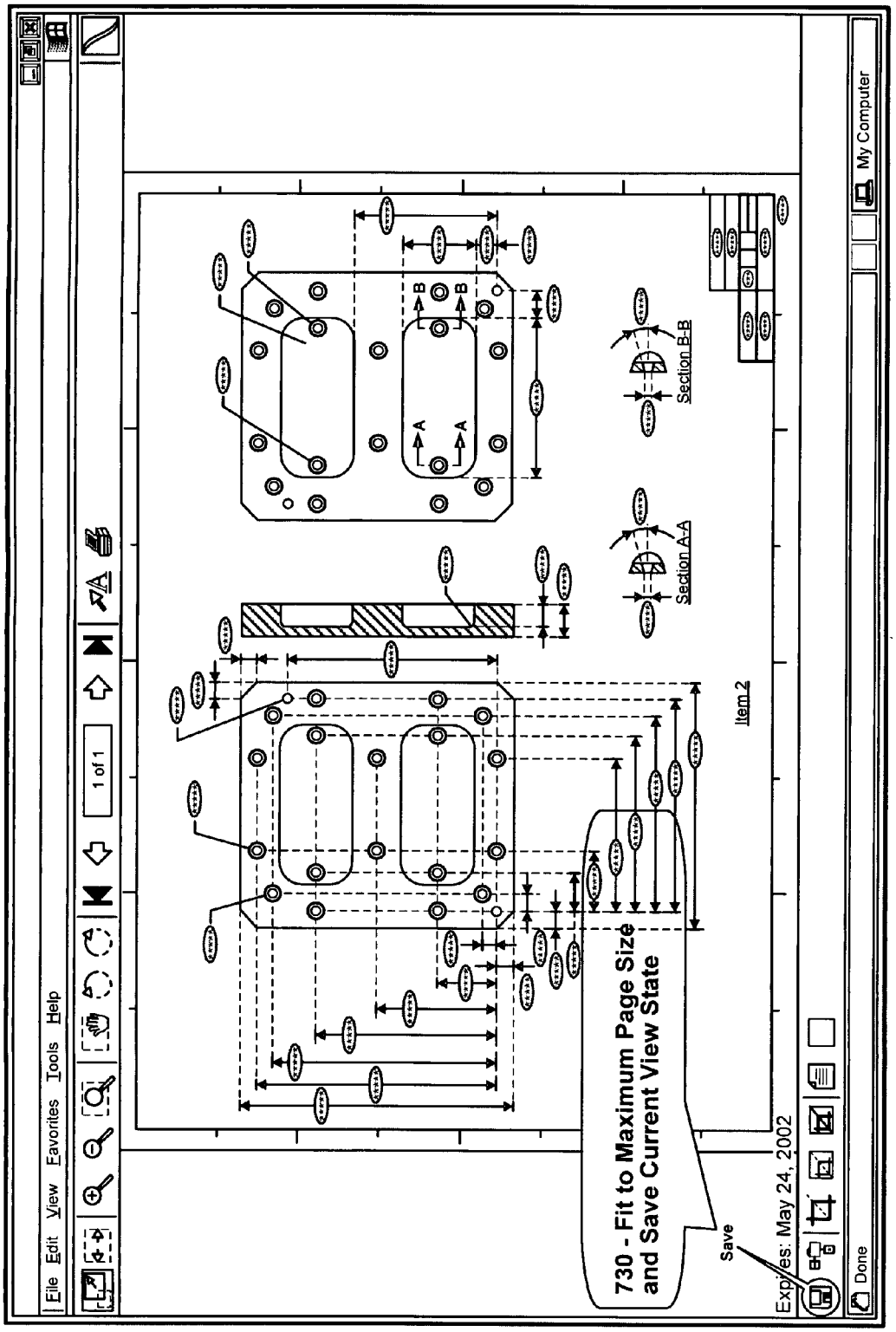
FIG. 7 illustrates a scaled version of the drawing in FIG. 6.

FIGS. 5, 6 and 7 illustrate how a view state can be saved. The image shown in FIG. 5 is the original image. The user clicks on the rotate button, as shown by button 710, until the image is in its proper orientation, as shown in FIG. 6. The user then fits the image to fit the display, as shown by button 720 in FIG. 6. The properly zoomed image is shown in FIG. 7. The user can then save this view state by clicking on the "Save View" button 730, shown in FIG. 7. This causes the application to save the changed rotation and zoom in the file header when the image is converted to the RFQ compressed format.

While the invention has been described in detail and with reference to specific embodiments thereof, it will be apparent to one skilled in the art that various changes and modifications can be made therein without departing from the spirit and scope thereof. Thus, it is intended that the present invention cover the modifications and variations of this invention provided they come within the scope of the appended claims and their equivalents.

What is claimed is:

1. A system, comprising:
    a processor configured to:
        load a first computer file, the first computer file including a first header portion and a first data portion, the first header portion providing meta-data about data stored in the first data portion, the first header portion having a plurality of header fields, the plurality of header fields including a first header field, the first header field including a first data tag and a first meta-data item, the first data tag indicating a first header field type associated with the first meta-data item, and the first meta-data item having a first view state;
        determine a viewing configuration for the data portion of the first computer file according to the first view state, the viewing configuration having a parameter, and the first view state including a first value corresponding to the parameter;
        present the content of the first data portion of the first computer file to a display device based on the viewing configuration;
        in response to a user request, manipulate the presenting corresponding to another viewing configuration having the parameter;
        capture a second view state from the another viewing configuration, the second view state including a second value corresponding to the parameter of the another viewing configuration;
        create a second header portion and a second data portion of a second computer file, the second header portion including a second header field, the second header field including a second data tag and a second meta-data item, and the second data portion including the content stored in the first data portion;
        store the first data tag in the second header field; and
        store the second view state in the second metadata item; and
        send the second computer file to a remote computer; and
    a memory coupled to the processor and configured to provide the processor with instructions.

2. The system of claim 1, wherein the first header portion includes a third header field having a third metadata item configured to be used by an online auction application to categorize the first computer file.

3. The system of claim 2, wherein the first computer file is categorized according to an originator of the first computer file, the originator of the first computer file is an auction sponsor, and the online auction application is a software application used to process files sent from auction sponsors for use in an electronic RFQ (request for quotations).

4. The system of claim 2, wherein at least two header fields are configured to be used in combination to categorize the first computer file.

5. The system of claim 4, wherein the at least two header fields include auction sponsor and auction event.

6. The system of claim 1, wherein the first header portion includes a fourth header field having a fourth metadata item, the fourth metadata item including auction information.

7. The system of claim 6, wherein the auction information includes auction sponsor information.

8. The system of claim 1, wherein the data in the first data portion includes compressed image data.

9. The system of claim 1, wherein the content comprises an image, and wherein the metadata in at least one header field is comprised of data that is configured to be used by an application to automatically configure how the image stored in the image data portion is displayed.

10. The system of claim 9, wherein the application is a software application used to display and print the image in the image data section, and the metadata in the at least one header field is used by the application to automatically configure how the image stored in the image data portion is printed.

11. The system of claim 9, wherein the data in said at least one header field includes at least one parameter from the group comprised of rotation, scale, horizontal offset, vertical offset and page number.

12. The system of claim 11, wherein the application automatically rotates the image by a value set by the rotation parameter.

13. The system of claim 11, wherein the application automatically zooms the image by a value set by the scale parameter.

14. The system of claim 11, wherein the application automatically shifts the image by values set in the horizontal offset and vertical offset parameters.

15. The system of claim 11, wherein if a value for the page number parameter is set to a predefined value, the application automatically configures how the image is displayed on every page of the image.

16. The system of claim 11, wherein the application automatically configures how the image is displayed on the page set by the page number parameter.

17. A computer program product, the computer program product being embodied in a computer readable storage medium and comprising computer instructions for:
loading a first computer file, the first computer file including a first header portion and a first data portion, the first header portion providing meta-data about data stored in the first data portion, the first header portion having a plurality of header fields, the plurality of header fields including a first header field, the first header field including a first data tag and a first meta-data item, the first data tag indicating a first header field type associated with the first meta-data item, and the first meta-data item having a first view state;
determining a viewing configuration for the data portion of the first computer file according to the first view state, the viewing configuration having a parameter, and the first view state including a first value corresponding to the parameter;
presenting the content of the first data portion of the first computer file to a display device based on the viewing configuration;
in response to a user request, manipulating the presenting corresponding to another viewing configuration having the parameter;
capturing a second view state from the another viewing configuration, the second view state including a second value corresponding to the parameter of the another viewing configuration;
creating a second header portion and a second data portion of a second computer file, the second header portion including a second header field, the second header field including a second data tag and a second metadata item, and the second data portion including the content stored in the first data portion;
storing the first data tag in the second header field; and
storing the second view state in the second metadata item; and
sending the second computer file to a remote computer.

18. The computer program product of claim 17, wherein the first header portion includes a third header field having a third metadata item configured to be used by an online auction application to categorize the first computer file.

19. The computer program product of claim 18, wherein the first computer file is categorized according to an originator of the first computer file, the originator of the first computer file is an auction sponsor, and the online auction application is a software application used to process files sent from auction sponsors for use in an electronic RFQ (request for quotations).

20. The computer program product of claim 18, wherein at least two header fields are configured to be used in combination to categorize the first computer file.

21. The computer program product of claim 17, wherein the first header portion includes a fourth header field having a fourth metadata item, the fourth metadata item including auction information.

22. The computer program product of claim 17, wherein the data in the first data portion includes compressed image data.

23. The computer program product of claim 17, wherein the content comprises an image, and wherein the metadata in at least one header field is comprised of data that is configured to be used by an application to automatically configure how the image stored in the image data portion is displayed.

24. The computer program product of claim 23, wherein the data in said at least one header field includes at least one parameter from the group comprised of rotation, scale, horizontal offset, vertical offset and page number.

25. The computer program product of claim 24, wherein the application automatically configures how the image is displayed on the page set by the page number parameter.

* * * * *